(12) United States Patent
De Cremoux

(10) Patent No.: US 7,116,134 B2
(45) Date of Patent: Oct. 3, 2006

(54) VOLTAGE COMPARATOR

(75) Inventor: Guillaume De Cremoux, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 41 days.

(21) Appl. No.: 10/506,277

(22) PCT Filed: Feb. 10, 2003

(86) PCT No.: PCT/IB03/00476

§ 371 (c)(1),
(2), (4) Date: Aug. 31, 2004

(87) PCT Pub. No.: WO03/075461

PCT Pub. Date: Sep. 12, 2003

(65) Prior Publication Data

US 2005/0083034 A1    Apr. 21, 2005

(30) Foreign Application Priority Data

Mar. 5, 2002  (EP)  .................................. 02075844

(51) Int. Cl.
*H03K 5/22*  (2006.01)

(52) U.S. Cl. .......................................... 327/77; 327/87
(58) Field of Classification Search .................. 327/57, 327/77, 78, 87, 89
See application file for complete search history.

(56) References Cited

U.S. PATENT DOCUMENTS 6,147,521 A  * 11/2000  Degoirat et al. ............... 327/81
6,294,934 B1   9/2001  Ching et al. ................. 327/108
6,417,699 B1 *  7/2002  Barnes ......................... 327/57

FOREIGN PATENT DOCUMENTS

EP           1026826 A2 *  8/2000

* cited by examiner

*Primary Examiner*—Long Nguyen
(74) *Attorney, Agent, or Firm*—Aaron Waxler

(57) ABSTRACT

A voltage comparator with comparing means that are energized upon the occurrence of a clock-edge and that are de-energized when the comparison operation is completed. The comparing means are preceded by a voltage divider (D) for dividing the voltage to be compared and a switch ($S_8$) in series with the voltage divider for preventing current flow through the voltage divider when the comparing means are de-energized.

2 Claims, 1 Drawing Sheet

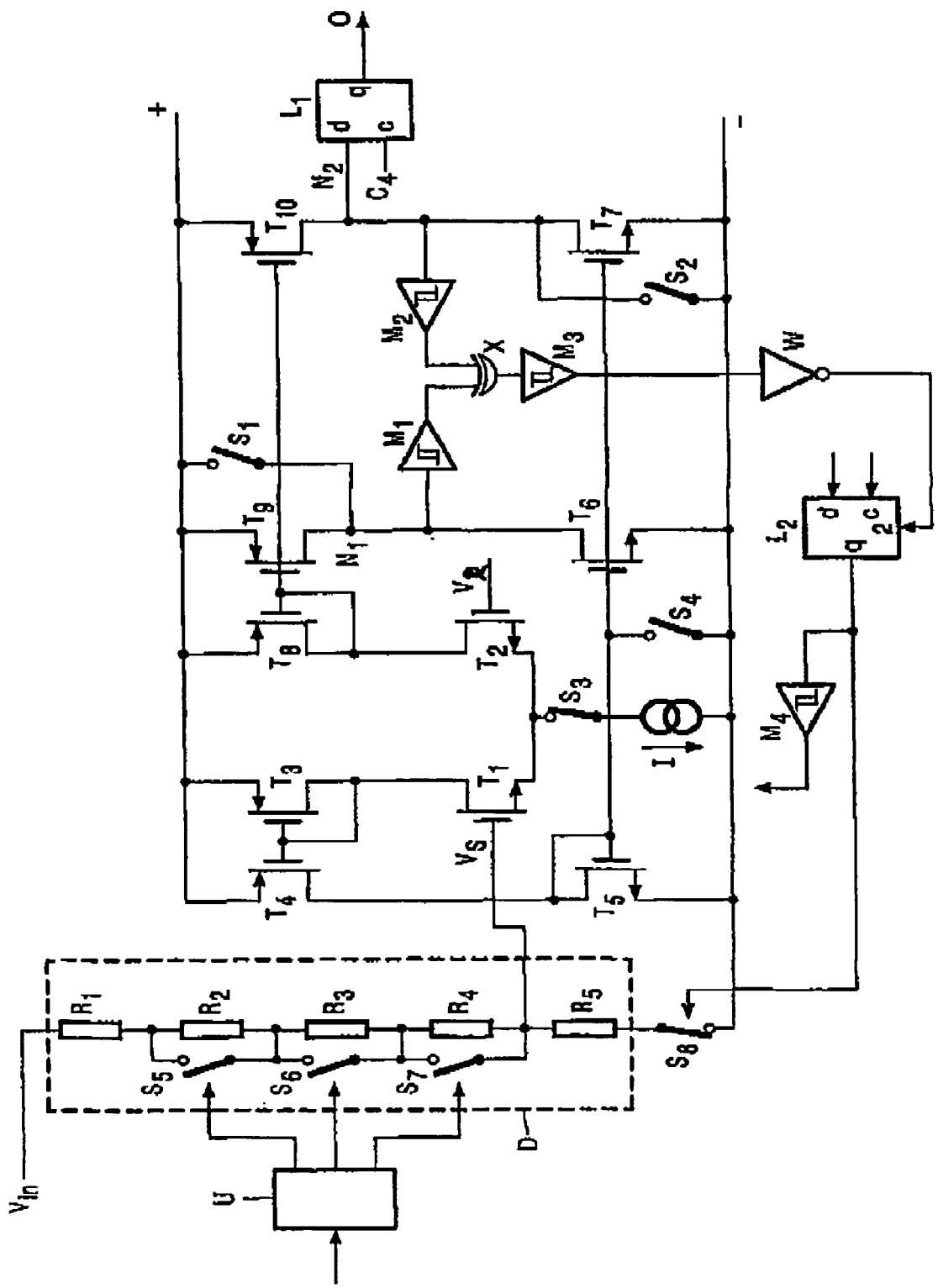

VOLTAGE COMPARATOR

The invention relates to a voltage comparator for comparing an input voltage with a reference voltage, said voltage comparator comprising comparing means and clock-signal controlled switching means connected to said comparing means for energizing the comparing means upon a transition of the clock-signal and means for determining the completion of a comparison and for controlling the switching means for switching off the energizing of the comparing means when the completion of a comparison is determined. A voltage comparator of this kind is known from European patent application 1.026.826.

Such comparators are of particular interest for monitoring the battery of mobile products. In such products it is of primary importance that on the one hand the battery charge is monitored with sufficient accuracy and on the other hand the voltage comparator itself draws as less current as possible from the battery. One way to minimize the consumption of the comparator is to operate the comparator with reduced bias current, however this goes at the cost of the accuracy of the measurement. Another way is to operate the comparator intermittently. This may e.g. be done by activating the comparator only on "high" states of a clock signal of 1 KHz with small duty cycle, so that the actual comparison operation takes place only during a small portion of the 1 mS clock period.

A drawback of this method is that, when the said portion is too small, the comparator is switched off when the comparison is not yet finished, so that an incorrect result is obtained. On the other hand, when the portion during which the comparator is active, is too high the power consumption of the comparator is unnecessarily high. To overcome this, the prior art voltage comparator comprises means to determine the instant of completion of the comparison and to switch the comparator off when this instant has arrived.

Conveniently, in the voltage comparators of the above described kind, the reference voltage is obtained by an arrangement which is known in the art as a "bandgap"-voltage generator. Such reference voltage is about equal to 1.2 Volt and is substantially temperature independent. However, this means tat input voltages can only be compared with 1.2 Volt. The present invention seeks to avoid this limitation while still a low power consumption of the voltage comparator is maintained and the voltage comparator of the invention is therefore characterized by a voltage divider for dividing the input voltage to be compared, the switching means comprising a switch connected in series with the voltage divider for inhibiting the flow of current through the voltage divider when the comparison means are de-energized. In this way, the power consumption of the voltage divider can be minimized to only a small fraction of the power consumption of an un-switched voltage divider. The lower power consumption also allows using a voltage divider of lower resistance with the advantage that lesser die area is occupied by the voltage divider.

The voltage comparator according to the present invention may be further characterized by said switching means comprising a Schmitt Trigger having an input which is controlled by the signal that controls said switch connected in series with the voltage divider, and whose output controls the energizing and de-energizing of the comparing means. The purpose of this Schmitt Trigger is to ensure that the said switch is fully "on" and consequently its impedance is sufficiently low, before the comparing means become operative.

The voltage comparator of the present invention may still further be characterized by said comparing means having two substantially identical outputs, said switching means being arranged to force different voltages to said outputs when the comparing means are de-energized and an exclusive OR gate connected to said two outputs for determining the completion of a comparison when the two output voltages are substantially equal and for controlling, through a clock controlled latch, the de-energizing of the comparing means and the switching off of the voltage divider. This arrangement presents a simple and reliable means for determining the conclusion of the comparing operation.

The invention will be described with reference to the accompanying FIGURE, which shows a synoptic circuit diagram of a voltage comparator according to the invention.

The voltage comparator of this figure comprises two NMOS transistor $T_1$ and $T_2$ whose source electrodes are interconnected to a common current source I. The gate electrode of the transistor $T_1$ is connected to a voltage to be sensed $V_s$ and the gate electrode of the transistor $T_2$ is connected to a reference voltage $V_r$. The drain current of transistor $T_1$ is mirrored through a first current mirror of PMOS transistors $T_3$, $T_4$, followed by a second current mirror of NMOS transistors $T_5$, $T_6$ and a third current mirror of said transistor $T_5$ and an NMOS transistor $T_7$. The drain current of transistor $T_2$ is mirrored through a fourth current mirror of PMOS transistors $T_8$, $T_9$ and a fifth current mirror of said transistor $T_8$ and a PMOS transistor $T_{10}$. The drain electrodes of the transistors $T_6$ and $T_9$ are interconnected to constitute an output node $N_1$ and the drain electrodes of transistors $T_7$ and $T_{10}$ are interconnected to constitute a second output node $N_2$. This latter output node is coupled, to an input d of a clocked latch $L_1$ with clock input c and output terminal q. This output terminal q is coupled to an output O of the voltage comparator. It may be observed that the nodes $N_1$ and $N_2$ constitute the output terminals of two output stages, which are, apart from the switches $S_1$ and $S_2$, identical in construction and whose output voltages consequently will end up at the same value. When this situation occurs the comparison may be considered as being finalized and the comparator may safely be cut off.

The nodes $N_1$ and $N_2$ are each connected through a Schmitt trigger $M_1$ and $M_2$ respectively to an input of a XOR-gate X. The output of the XOR gate X resets a second clock-controlled latch $L_2$, through a third Schmitt trigger $M_3$ and an inverter W. Equally as the latch $L_1$, also the latch $L_2$ comprises an input terminal d, an output terminal q, a clock input c and moreover a reset input r. The input terminal d is connected to the positive supply voltage. When a rising edge appears at the clock input c, the latch will transmit the positive voltage at the input d to its output q and when the reset input r receives a "high" from the inverter W the output q of the latch will return to "low".

The voltage comparator of FIG. 1 further comprises switches $S_1$, $S_2$, $S_3$ and $S_4$ that are controlled by the output q of the latch $L_2$ through a fourth Schmitt trigger $M_4$. The connections between this Schmitt Trigger and the switches are not shown in the figure. The switch $S_1$ connects the node $N_1$ to the positive supply when the latch $L_2$ is reset and the switch $S_2$ connects the node $N_2$ to the negative supply when this latch $L_2$ is reset. Therefore, one of the inputs of the XOR-gate X is "high" and the other input is "low" making the output of the XOR-gate "high". When the latch $L_2$ is reset, the switch $S_3$ disconnects the interconnected source electrodes of the comparator transistors $T_1$ and $T_2$ from the current source I and the switch $S_4$ connects the gate electrodes of the current mirror transistors $T_5$, $T_6$ and $T_7$ to the negative supply In operation, when a rising edge appears at the clock input c of the latch $L_2$, its output q will, through the Schmitt trigger $M_4$, open the switches $S_1$, $S_2$ and $S_4$ and close the switch $S_3$, as shown in the figure. This will put the comparator into operation and the two nodes $N_1$ and $N_2$ will not be stuck anymore to the positive and negative supply voltages respectively. When the voltage to be sensed $V_s$ is higher than the reference voltage $V_r$, the drain current of $T_1$, mirrored to $T_6$, will pull the voltage of the node $N_1$ down until this voltage is equal to the voltage of node $N_2$. On the other hand, when the voltage $V_s$ is lower than the reference voltage $V_r$, the drain current of $T_2$, mirrored to $T_{10}$ will push the voltage of the node $N_2$ up until this voltage is equal to the voltage of node $N_1$. In both cases the end result is that the two node voltages are equal, so that the output of the XOR-gate will fall to "low". This will through the Schmitt trigger $M_3$ give a "high" at the output of the inverter W. This "high" will reset the latch $L_2$, the output of this latch becomes "low" and this will deactivate the comparator circuit until a new rising edge of the clock input appears. Consequently, when the comparison operation is completed the comparator will be shut off and any further power consumption is stopped. A standard comparator draws in operation a bias current that is typically 2 μA. The comparison time is 5 μs in the worst case. When the comparison is performed every 1000 μs, then the average consumption of the comparator is reduced to 2 μA/200=10 nA. It may be noted that the Schmitt Triggers, the XOR gate and the latches in CMOS technology, just like other gates in this technology, only draw a very short peak of current during the transition from "Low" to "High" and vice versa.

As explained in the introduction, the reference voltage $V_r$, often has a fixed value of 1.2V. In order to be able to compare at a plurality of voltage levels, the voltage comparator of figure 1 comprises a voltage divider D, which has a plurality of series connected resistors $R_1$, $K_2$, $K_3$, $R_4$, $K_5$ and switches $S_5$, $S_6$ and $S_7$ bridging the resistors $R_2$, $R_3$ and $R_4$ respectively. Moreover in series wit the voltage divider is a switch Sa, connected between the resistor K5 and the negative supply terminal (ground). The voltage $V_{in}$, whose value has to be monitored by the voltage comparator, is applied to the resistor $R_1$ and the voltage $V_s$ that is applied to the gate electrode of the transistor $T_1$, is derived from the interconnection of the resistors $R_4$ and $K_5$. A control unit U controls the position of the switches $S_5$, $S_6$ and $S_7$ so that several comparison levels can be set. Of course, when only one comparison level is required, the switches $S_5$, $S_6$ and $S_7$ can be dispensed with and one single resistor can replace the resistors $R_1$ to $R_4$.

The switch $S_8$ is controlled by the output of the latch $L_2$, substantially simultaneously with the switches $S_1$ to $S_4$. Thus, when the comparator is switched off from the supply, also current through the voltage divider is stopped so that the battery to be monitored is no longer loaded. This is a very important feature of the comparator shown in the FIGURE. With a 300 kΩ voltage divider and a voltage $V_{in}$ to be monitored of 3 Volt the current through the voltage divider is 10 μA i.e. substantially more than the operational current of the comparator. By switching off the voltage divider substantially simultaneously with the switching off of the comparator the mean current through the voltage divider is reduced by the same factor (e.g. 200) as the reduction of the mean current of the comparator. The resistance value of the voltage divider can also be reduced, e.g. from 300 kΩ to 100 kΩ. to decrease the die area Resistor dividers are among the components that are most responsible for the consumption of die area in the IC. The switching of the voltage divider enables thus to reduce simultaneously the die area (e.g. with a factor 3) and the current consumption (e.g. with a factor of nearly 70).

Two capacitors (not shown) may be connected across the source-drain path of the transistors $T_6$ and $T_{10}$ respectively. They prevent any parasitic simultaneous bias of both nodes $N_1$ and $N_2$ to the same value just after the trigger of the comparator, because this would lead to a wrong detection.

Special attention has to be paid to the function of the Schmitt Trigger $M_4$. This Schmitt Trigger ensures that the comparator is not switched on before the switching voltage to the switch $S_8$ has reached a sufficiently high value. Consequently it is ensured that the resistive voltage divider is sufficiently "on" when the comparator becomes operative. The Schmitt Trigger also ensures that the switching of the comparator is done in a very short period of time, so that it is immediately fully operative. For example, if the supply voltage is 3 Volts then the switching voltage to the switches $S_1$ to $S_4$ will switch from 0 to 3V when the switching voltage to the switch $S_8$ will have reached almost 3V e.g. 2,5 V.

For similar reasons the Schmitt triggers $M_1$ to $M_3$ are introduced. The Schmitt triggers $M_1$ and $M_2$ ensure that the nodes $N_1$ and $N_2$ effectively reach an equal value before to shut down the comparator. This is an additional security along with the aforementioned capacitors. The Schmitt trigger $M_3$ ensures that the output at node $N_2$ is effectively stored in the latch $L_1$ before the comparator is shut down.

The invention claimed is:

1. A voltage comparator for comparing an input voltage with a reference voltage, said voltage comparator comprising: comparing means ($T_1$ to $T_{10}$), and clock-signal controlled switching means (S1to $S_4$) connected to said comparing means for energizing the comparing means upon a transition of a clock-signal, determining means ($M_1$, $M_2$, X, $M_3$, V) for determining a completion of a comparison and for controlling the clock-signal controlled switching means ($S_1$ to $S_4$) for de-energizing the comparing means when the completion of a comparison is determined, and a voltage divider (D) for dividing the input voltage to be compared, the clock-signal controlled switching means comprising a switch ($S_8$) connected in series with the voltage divider (D) for inhibiting a flow of current through the voltage divider when the comparison means is de-energized wherein said clock-signal controlled switching means comprising a Schmitt Trigger ($M_4$) having an input which is controlled by a signal that controls said switch ($S_8$) connected in series with the voltage divider, and having an output controls the energizing and de-energizing of the comparing means.

2. A voltage comparator for comparing an input voltage with a reference voltage, said voltage comparator comprising: comparing means ($T_1$ to $T_{10}$), and clock-signal controlled switching means ($S_1$ to $S_4$) connected to said comparing means for energizing the comparing means upon a transition of a clock signal, determining means ($M_1$, $M_2$, X, $M_3$, V) for determining the a completion of a comparison and for controlling the clock-signal controlled switching means ($S_1$ to $S_4$) for de-energizing the comparing means when the completion of a comparison is determined, a voltage divider (D) for dividing the input voltage to be compared, the clock-signal controlled switching means comprising a switch ($S_8$) connected in series with the voltage divider (D) for inhibiting the a flow of current through the voltage divider when the comparison means is de-energized wherein said comparing means having two substantially identical outputs ($N_1$, $N_2$), said clock-signal controlled switching means being arranged to force different voltages to said two substantially identical outputs when the comparing means is de-energized and said determining means comprising an exclusive OR gate (X) connected to said two substantially identical outputs for determining the completion of a comparison when the two output voltages of said two substantially identical outputs are substantially equal and for controlling, through a clock controlled latch ($L_2$), the de-energizing of the comparing means and the inhibition of current flow through the voltage divider.

* * * * *